(12) United States Patent
Barns et al.

(10) Patent No.: US 7,754,552 B2
(45) Date of Patent: Jul. 13, 2010

(54) PREVENTING SILICIDE FORMATION AT THE GATE ELECTRODE IN A REPLACEMENT METAL GATE TECHNOLOGY

(75) Inventors: Chris E. Barns, Portland, OR (US);
Justin K. Brask, Portland, OR (US);
Mark Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1440 days.

(21) Appl. No.: 10/629,127

(22) Filed: Jul. 29, 2003

(65) Prior Publication Data

US 2005/0026408 A1    Feb. 3, 2005

(51) Int. Cl.
*H01L 21/338* (2006.01)

(52) U.S. Cl. .................. 438/183; 438/692; 438/735; 438/738; 438/744; 438/756

(58) Field of Classification Search .............. 438/183, 438/587, 595, 642, 648, 649, 650, 651, 655, 438/301, 300
See application file for complete search history.

(56) References Cited

U.S. PATENT DOCUMENTS

| | | | | | |
|---|---|---|---|---|---|
| 4,269,654 A | * | 5/1981 | Deckert et al. | ............. | 438/756 |
| 5,023,694 A | * | 6/1991 | Yeh | ............. | 257/632 |
| 5,672,527 A | * | 9/1997 | Lee | ............. | 438/275 |
| 6,025,267 A | * | 2/2000 | Pey et al. | ............. | 438/656 |
| 6,043,157 A | * | 3/2000 | Gardner et al. | ............. | 438/692 |
| 6,051,487 A | * | 4/2000 | Gardner et al. | ............. | 438/585 |
| 6,083,836 A | * | 7/2000 | Rodder | ............. | 438/690 |
| 6,248,002 B1 | * | 6/2001 | Wang et al. | ............. | 451/41 |
| 6,258,648 B1 | * | 7/2001 | Lee | ............. | 438/238 |
| 6,417,109 B1 | * | 7/2002 | Jordan et al. | ............. | 438/692 |
| 6,420,273 B1 | * | 7/2002 | Lin | ............. | 438/706 |
| 6,475,908 B1 | * | 11/2002 | Lin et al. | ............. | 438/659 |
| 6,586,288 B2 | * | 7/2003 | Kim et al. | ............. | 438/183 |
| 6,586,311 B2 | * | 7/2003 | Wu | ............. | 438/382 |
| 6,800,530 B2 | * | 10/2004 | Lee et al. | ............. | 438/301 |

\* cited by examiner

*Primary Examiner*—Zandra Smith
*Assistant Examiner*—Khanh B Duong
(74) *Attorney, Agent, or Firm*—Trop, Pruner & Hu, P.C.

(57) ABSTRACT

A hard mask may be formed and maintained over a polysilicon gate structure in a metal gate replacement technology. The maintenance of the hard mask, such as a nitride hard mask, may protect the polysilicon gate structure 14 from the formation of silicide or etch byproducts. Either the silicide or the etch byproducts or their combination may block the ensuing polysilicon etch which is needed to remove the polysilicon gate structure and to thereafter replace it with an appropriate metal gate technology.

11 Claims, 2 Drawing Sheets

PREVENTING SILICIDE FORMATION AT THE GATE ELECTRODE IN A REPLACEMENT METAL GATE TECHNOLOGY

BACKGROUND

This invention relates generally to metal gate replacement technology.

In the fabrication of integrated circuits, it is sometimes desirable to selectively replace polysilicon gate structures with metal gate structures. To this end, some of the polysilicon gate structures may be removed and replaced with a metal gate structure.

Dual polysilicon gates are used in conventional complementary metal oxide semiconductor devices to engineer a desired low threshold voltage that is symmetric between NMOS and PMOS devices. Unfortunately, as the device's scale becomes smaller, this approach is not effective. When the polysilicon doping level is not sufficiently high, the polysilicon gate depletion effectively increases the gate dielectric thickness by several Angstroms. This negatively impacts the ability to scale gate dielectric thicknesses. Boron penetration and gate resistance may also be an issue for such polysilicon gate technology.

One approach to this problem is to replace the polysilicon gate with a metal gate. More, particularly, one metal gate may be utilized for the NMOS device and a different metal gate may be utilized for the PMOS device.

Thus, it may be desirable to form dual metal gate technology from conventional processing steps that use polysilicon. After the polysilicon has been defined to form the gate electrode for a transistor, the polysilicon may be removed. A different metal may be applied to form each of the NMOS and PMOS transistors.

In many polysilicon gate processes, a silicide is formed on the upper portion of the polysilicon gate. However, the formation of a silicide may make it very difficult to remove the polysilicon gate and to replace that polysilicon gate structure with a metal gate. In addition, the formation of etch byproduct residue may also block the polysilicon gate etch and removal sequence.

One solution to this problem is to overetch the silicide or etch byproduct residue. However, such overetching may result in adverse consequences to other materials. For example, the underlying gate oxide beneath the polysilicon gate may be etched due to the over extended polishing required for removal of the silicide or etch byproduct residue. Another solution is to use a nitride mask on top of the polysilicon to block silicide formation on the polysilicon while allowing silicide formation on the source/drain region.

Generally, a polysilicon opening polish process may result in excessive dishing in the field oxide areas before the nitride on the top of the polysilicon gates is removed. If too much of the field oxide is lost, then the metal gate height is reduced and there may not be enough oxide left to reliably prevent the dishing in the damascene polish step from exposing the silicon surface.

Thus, there is a need for an improved technique for removing polysilicon gates as part of a metal gate replacement technology.

DETAILED DESCRIPTION

Figure 1:
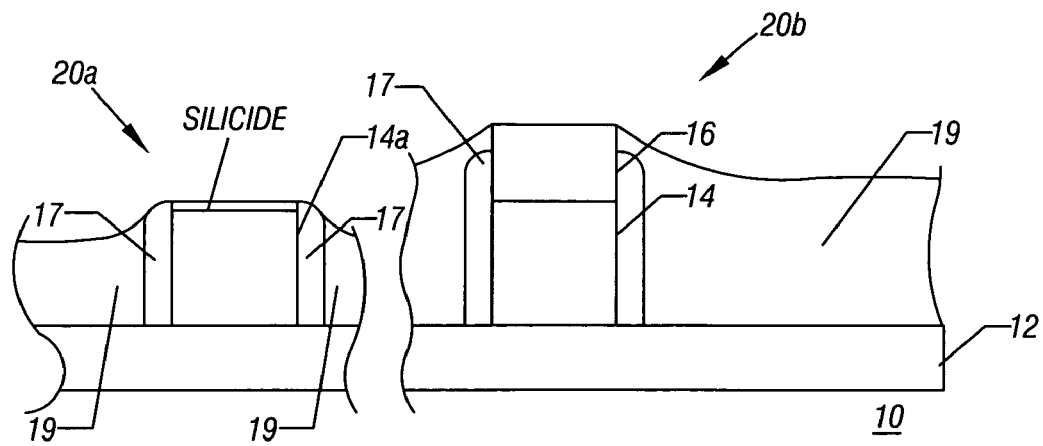
FIG. 1 is a simplified, enlarged, partial cross-sectional view of one embodiment of the present invention at an early stage of manufacture.

Referring to FIG. 1, a semiconductor wafer includes a substrate 10, such as a silicon substrate, that may be covered with a dielectric material 12 such as an oxide. Over the dielectric material 12 may be a patterned polysilicon gate structure 14 and a patterned polysilicon gate structure 14a.

Over the polysilicon gate structure 14 may be a mask 16 that, in one embodiment, may be a relatively thick nitride hard mask. The mask 16 is normally removed. However, in accordance with one embodiment of the present invention, the mask 16 is maintained over those transistor areas 20b (that will become replacement metal gate transistors) until the gate opening polish step in one embodiment of the present invention. The gate structure 14 in the areas 20b may be replaced with metal replacement.

A raised spacer 17 may be formed on sides of the polysilicon gate structure 14 to prevent silicide from forming at the edges. The spacer 17 may be formed of an insulator such as nitride or oxide.

Another polysilicon gate structure 14a in the area 20a may have its mask 16 removed and that gate structure 14a may have silicide formed on it. The gate structure 14a may be used for a polysilicon transistor.

In the gate opening polish step, an interlayer dielectric layer 19 may be polished down to the top of the mask 16 to enable the etch removal of the mask 16.

In one embodiment, a two-step polish process may involve a first stage using a hard pad to planarize and remove material in the vicinity of the tops of the mask 16 covered polysilicon gate structures 14. A second polish stage may utilize a soft pad and/or a slurry optimized to remove some or all of the mask material on top of the polysilicon gate structure 14.

Figure 2:
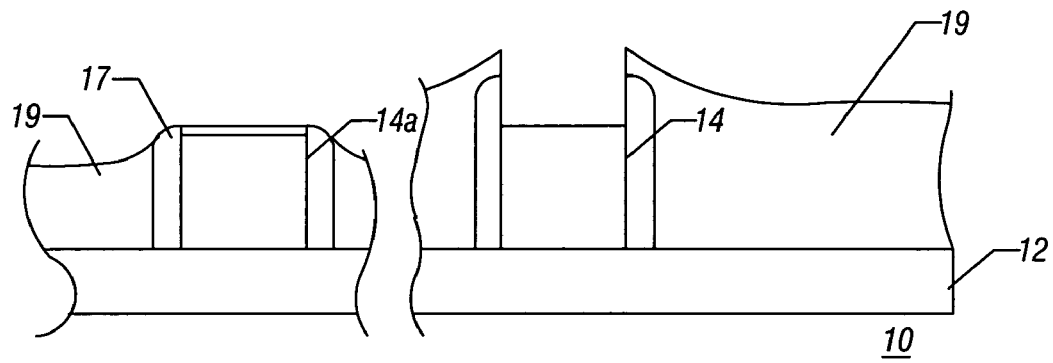
FIG. 2 is a simplified, enlarged, partial cross-sectional view of the embodiment shown in FIG. 1 after further processing in accordance with one embodiment of the present invention.

The mask 16 may be etched away with a selective etch process to form the structure shown in FIG. 2 after the silicidation processing has been completed in the areas 20a. A selective etch, such as $H_3PO_4$, may be used in some embodiments. In FIG. 2, the polysilicon gate structure 14 is now exposed. The gate structure 14a is silicided in one embodiment of the present invention.

A selective etch of the polysilicon gate structure 14 is used to remove the polysilicon gate structure 14 from the dielectric 12. The removal of the polysilicon gate structure 14 may involve the use of a selective etch. Suitable selective etches include $NH_4OH$ for NMOS gate structures 14 and tetramethylammonium hydroxide (TMAH) for PMOS gate structures 14. Since the gate structure 14 is substantially free of silicide it may ultimately be removed more easily.

Figure 3:
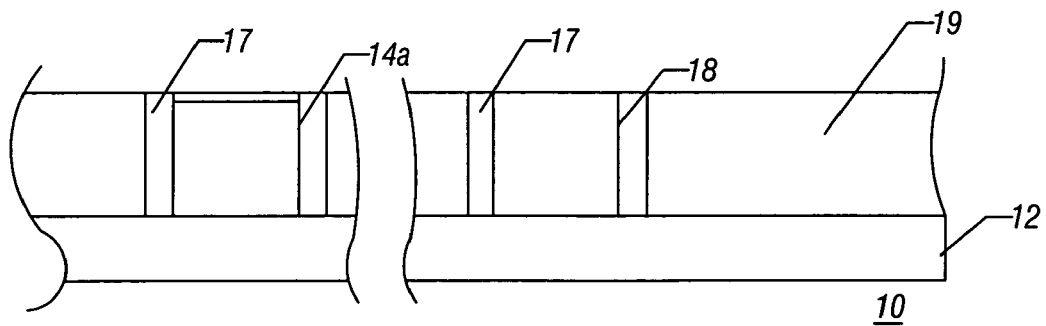
FIG. 3 is a simplified, enlarged, partial cross-sectional view of the embodiment shown in FIG. 2 after subsequent processing in accordance with one embodiment of the present invention.

Thereafter, a metal gate structure 18 may be deposited and patterned to achieve the structure shown in FIG. 3. In accordance with some embodiments of the present invention, a polysilicon gate structure 14 to be replaced may be protected from silicidation. In addition, in some embodiments, a high quality etch may be utilized. Also, the dielectric lost during polishing may be reduced in some embodiments.

In some embodiments, improved etch reliability and improved dielectric maintenance may be achieved. These results may, in some embodiments, enable better margins in the later metal gate damascene polishing steps.

In another embodiment of the present invention, a mask etch stop layer may be located above the mask 16 at the point shown in FIG. 1. In this case, the polish may stop after exposing the etch stop layer and a mask etch may be used to remove the etch stop layer and the mask 16.

In still another embodiment of the present invention, a slurry may be used that has a higher mask 16 polish removal rate than the dielectric 19 removal rate. This combines the functionality of the mask etch with the polish and may reduce or eliminate the mask etch part of the process shown in FIGS. 1 through 3.

In one embodiment, the polishing of the structure may only expose the top of the mask 16. This exposes the dielectric material 19 to a reduced over-polishing relative to other techniques.

Figure 4:
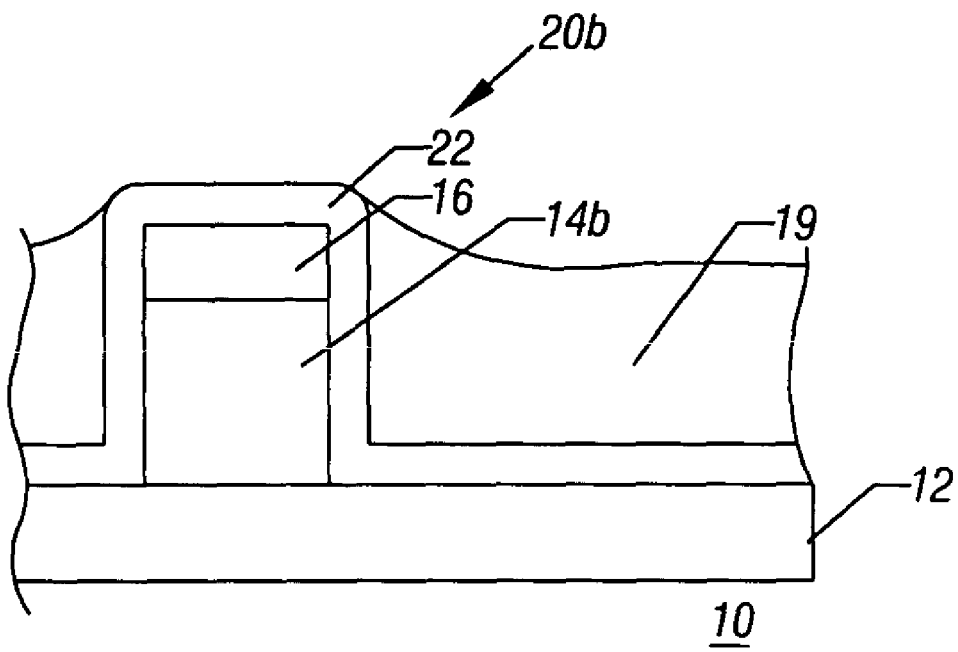
FIG. 4 is a simplified, enlarged, partial cross-sectional view of another embodiment of the present invention.
Figure 5:
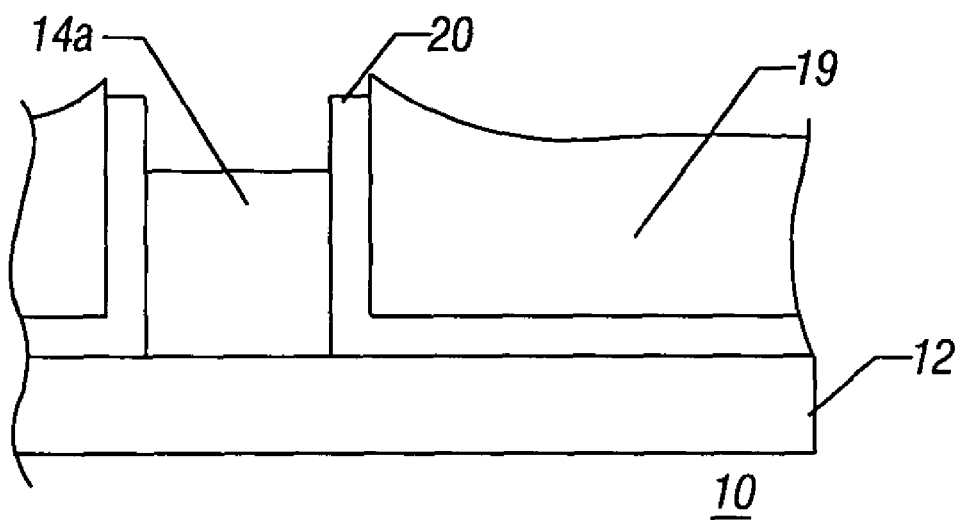
FIG. 5 is a simplified, enlarged, partial cross-sectional view of the embodiment shown in FIG. 4 further processing.

Referring to FIG. 4 in accordance to another embodiment of the present invention, a nitride layer 22 may be formed over the gate structure 14 and mask 16. An interlayer dielectric 19 may overlie the lower portions of the nitride layer 22. Some of the overlying interlayer dielectric material 19 may be polished away to achieve the structure shown in FIG. 4. Thereafter, an etching process may remove the exposed nitride layer 22 and the mask 16 as shown in FIG. 5.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   covering a polysilicon gate structure with a hard mask to prevent the formation of a silicide on the gate structure, said mask and said gate structure having opposed, common vertical surfaces; and
   forming a sidewall spacer that extends along a vertical surface and covers said gate structure and covers at least part of said mask; and
   removing said hard mask using an etch that is selective of the hard mask over the spacer.

2. The method of claim 1 including protecting the polysilicon gate structure with a hard mask to prevent the formation of a silicide.

3. The method of claim 2 including protecting the polysilicon gate structure with a nitride hard mask to prevent the formation of a silicide.

4. The method of claim 1 including removing said mask after forming a silicide.

5. The method of claim 4 including removing said mask by etching.

6. The method of claim 4 including removing said mask by polishing.

7. The method of claim 4, including polishing said mask then etching said mask.

8. The method of claim 1 including replacing the polysilicon gate structure with a metal gate replacement.

9. The method of claim 1 including forming the polysilicon gate structure including a patterned polysilicon portion and an underlying dielectric layer.

10. The method of claim 9 including protecting the underlying dielectric layer from overetching.

11. The method of claim 1 including forming spacers on either side of said polysilicon gate structure to prevent lateral silicide formation.

* * * * *